(12) United States Patent
Lien et al.

(10) Patent No.: US 12,651,637 B2
(45) Date of Patent: Jun. 9, 2026

(54) READ OPERATION WITH CAPACITY USAGE DETECTION SCHEME

(71) Applicant: Micron Technology, Inc., Boise, ID (US)

(72) Inventors: Yu-Chung Lien, San Jose, CA (US); Jun Wan, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 264 days.

(21) Appl. No.: 18/388,506

(22) Filed: Nov. 9, 2023

(65) Prior Publication Data

US 2024/0177781 A1 May 30, 2024

Related U.S. Application Data

(60) Provisional application No. 63/428,595, filed on Nov. 29, 2022.

(51) Int. Cl.
| | |
|---|---|
| *G11C 16/28* | (2006.01) |
| *G11C 16/08* | (2006.01) |
| *G11C 16/24* | (2006.01) |

(52) U.S. Cl.
CPC .............. *G11C 16/28* (2013.01); *G11C 16/08* (2013.01); *G11C 16/24* (2013.01)

(58) Field of Classification Search
CPC .......... G11C 16/28; G11C 16/08; G11C 16/24

USPC ................................................... 365/189.011
See application file for complete search history.

(56) References Cited

U.S. PATENT DOCUMENTS

| | | | | |
|---|---|---|---|---|
| 2011/0273935 A1* | 11/2011 | Dong | ................. | G11C 11/5642 |
| | | | | 365/185.25 |
| 2013/0083607 A1* | 4/2013 | Joo | ........................ | G11C 16/08 |
| | | | | 365/185.21 |
| 2018/0102167 A1* | 4/2018 | Yim | ................... | G11C 16/3459 |
| 2022/0189568 A1* | 6/2022 | Lee | ........................ | G11C 16/08 |

* cited by examiner

*Primary Examiner* — Amir Zarabian
*Assistant Examiner* — Daniel John King
(74) *Attorney, Agent, or Firm* — Lowenstein Sandler LLP

(57) ABSTRACT

A method for partial block read compensation can include receiving a read request that specifies a memory cell connected to a string of series-connected memory cells in an array of memory cells on a memory device, the string located at an intersection of a wordline and a bitline, and causing a first voltage applied to the wordline to which the specified memory cell is connected to ramp to a first predetermined value. The method can include causing a second voltage applied to the bitline to which the specified memory cell is connected to ramp to a second predetermined value, and can include comparing, using a current comparator, a current along the string with a reference current to generate an analog output signal. It can also include causing a voltage offset, based on the analog output signal, to be applied to a read voltage level during a sensing operation.

20 Claims, 8 Drawing Sheets

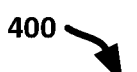

400

Receiving a read request that specifies a memory cell connected to a string of a series-connected memory cells in an array of memory cells on a memory device 420

Causing a first voltage applied to the wordline to which the specified memory cell is connected to ramp to a first predetermined value 422

Causing a second voltage applied to the bitline to which the specified memory cell is connected to ramp to a second predetermined value 424

Comparing, using a current comparator, a current along the string with a reference current to generate an analog output signal 426

Causing a voltage offset, based on a magnitude of the analog output signal, to be applied to a read voltage level during a sensing operation performed on the specified memory cell 428

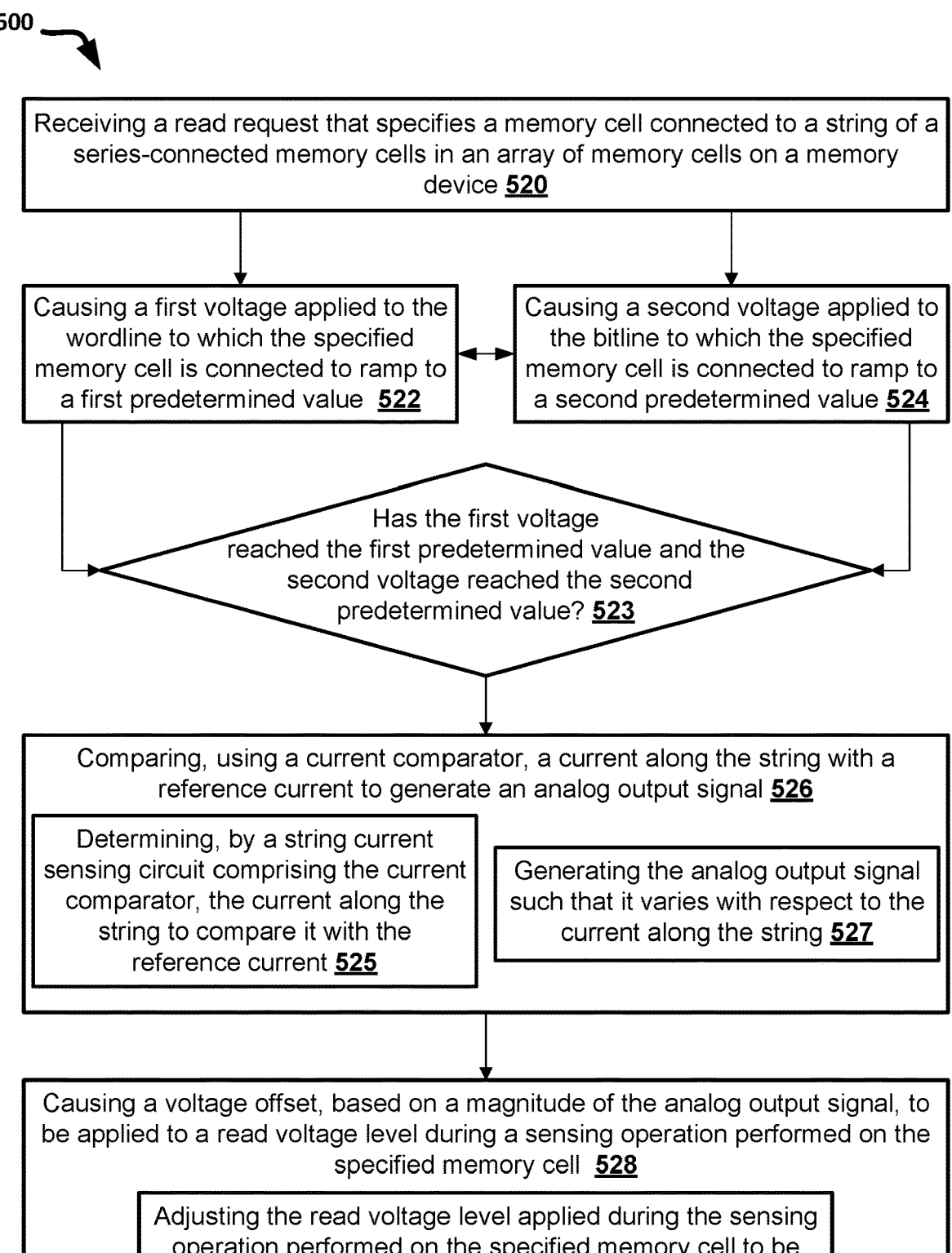

Receiving a read request that specifies a memory cell connected to a string of a series-connected memory cells in an array of memory cells on a memory device 520

Causing a first voltage applied to the wordline to which the specified memory cell is connected to ramp to a first predetermined value 522

Causing a second voltage applied to the bitline to which the specified memory cell is connected to ramp to a second predetermined value 524

Has the first voltage reached the first predetermined value and the second voltage reached the second predetermined value? 523

Comparing, using a current comparator, a current along the string with a reference current to generate an analog output signal 526

Determining, by a string current sensing circuit comprising the current comparator, the current along the string to compare it with the reference current 525

Generating the analog output signal such that it varies with respect to the current along the string 527

Causing a voltage offset, based on a magnitude of the analog output signal, to be applied to a read voltage level during a sensing operation performed on the specified memory cell 528

Adjusting the read voltage level applied during the sensing operation performed on the specified memory cell to be offset by an amount corresponding to the analog output signal 529

FIG. 5

READ OPERATION WITH CAPACITY USAGE DETECTION SCHEME

RELATED APPLICATIONS

This application claims the benefit of priority from co-pending U.S. Provisional Patent Application No. 63/428,595, filed Nov. 29, 2022, which is incorporated herein by reference.

TECHNICAL FIELD

Embodiments of the disclosure generally relate to memory sub-systems, and more specifically, relate to managing and adjusting voltage levels applied for accessing memory cells on partially programmed blocks of memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure. The drawings, however, should not be taken to limit the disclosure to the specific embodiments, but are for explanation and understanding only.

FIG. 4 is a flow diagram of an example method for performing partial block read compensation on memory devices in accordance with some embodiments of the present disclosure;

FIG. 5 is a flow diagram of another example method for performing partial block read compensation in accordance with some embodiments of the present disclosure.

DETAILED DESCRIPTION

Figure 1:
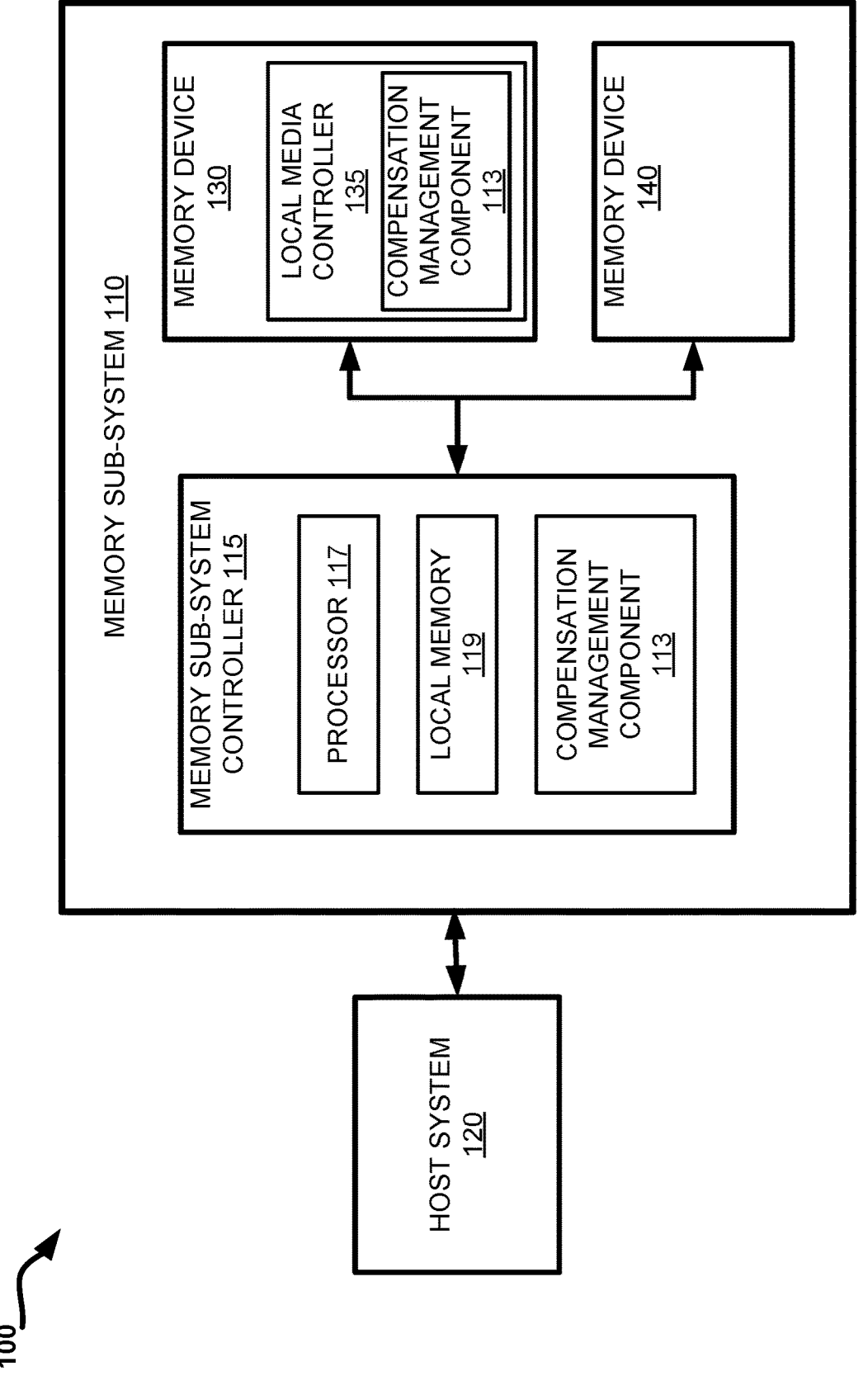
FIG. 1 illustrates an example computing system that includes a memory sub-system in accordance with some embodiments of the present disclosure.

Aspects of the present disclosure are directed to managing and adjusting voltage levels applied for accessing memory cells on partially programmed blocks of memory devices. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane can consist of a set of physical blocks. In some embodiments, each block can include multiple sub-blocks. Each block can consist of a set of pages. Each page can consist of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include cells arranged in a two-dimensional or three-dimensional grid. Memory cells can be formed onto a silicon wafer in an array of columns connected by conductive lines (also hereinafter referred to as strings, bitlines, or BLs) and rows connected by conductive lines (also hereinafter referred to as wordlines or WLs). A wordline can refer to a conductive line that connects control gates of a set (e.g., one or more rows) of memory cells of a memory device that are used with one or more bitlines to generate the address of each of the memory cells. In some embodiments, each plane can carry an array of memory cells formed onto a silicon wafer and joined by conductive BLs and WLs, such that a wordline joins multiple memory cells forming a row of the array of memory cells, while a bitline joins multiple memory cells forming a column of the array of memory cells. The intersection of a bitline and wordline constitutes the address of the memory cell. A block hereinafter refers to a unit of the memory device used to store data and can include a group of memory cells, a wordline group, a wordline, or individual memory cells addressable by one or more wordlines. One or more blocks can be grouped together to form separate partitions (e.g., planes) of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

In some devices, the array of memory cells for NAND flash memory can be arranged such that the control gate of each memory cell of a row of the array is connected together to form an access line (e.g., a wordline). Columns of the array can include strings (referred to as NAND strings) of memory cells connected together in series between a pair of select gates (e.g., a source select transistor and a drain select transistor). Each source select transistor can be connected to a source, while each drain select transistor can be connected to a data line (e.g., a column bitline). The array can be arranged in rows (each corresponding to a wordline) and columns (each corresponding to a bitline). Each column may include a string of series-connected memory cells (e.g., non-volatile memory cells), such that each bitline might connect together one or more NAND strings. Each NAND string might be connected (e.g., selectively connected) to a common source and might include one or more memory cells (i.e., one or more memory cells can be directly connected to each NAND string that is, in turn, directly connected to a bitline). The memory cells of each NAND string can be connected in series between a select gate (e.g., a field-effect transistor) that may be a source select transistor, commonly referred to as select gate source, and a select gate that may be a drain select transistor, commonly referred to as select gate drain.

A cell can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_t$ (also referred to as the "threshold voltage") such that the source-drain electric current is low for the control gate voltage ($V_{CG}$) being below the threshold voltage, $V_{CG} < V_t$. The current increases substantially once the control gate voltage has exceeded the threshold voltage, $V_{CG} > V_t$. Because the actual geometry of the electrodes and gates varies from cell to cell, the threshold voltages can be different even for cells implemented on the same die. The cells can, therefore, be characterized by a distribution P of the threshold voltages, $P(Q, V_t) = dW/dV_t$, where dW represents the probability that any given cell has its threshold voltage within the interval $[V_t, V_t + dV_t]$ when charge Q is placed on the cell.

A programming operation can be performed by applying a series of incrementally increasing programming pulses to the control gate of a memory cell being programmed. A program verify operation after each programming pulse can determine the threshold voltage of the memory cell resulting from the preceding programming pulse. When memory cells are programmed, the level of the programming achieved in a cell (e.g., the $V_t$ of the cell) is verified, in effect, by comparing the cell $V_t$ to a target (i.e., desired) program verify (PV) voltage level. The PV voltage level can be provided by an external reference.

A program verify operation involves applying a ramped voltage to the control gate of the memory cell being verified. When the applied voltage reaches the threshold voltage of the memory cell, the memory cell turns on and sense circuitry detects a current on a bit line coupled to the memory cell. The detected current activates the sense circuitry and determines the present threshold voltage of the cell. The sense circuitry can determine whether the present threshold voltage is greater than or equal to the target threshold voltage. If the present threshold voltage is greater than or equal to the target threshold voltage, further programming is not needed. Otherwise, programming continues in this manner with the application of additional program pulses to the memory cell until the target $V_t$ and data state is achieved.

Accordingly, certain non-volatile memory devices can use a demarcation voltage (i.e., a read reference voltage) to read data stored at memory cells. For example, a read reference voltage (also referred to herein as a "read voltage") can be applied to the memory cells, and if a threshold voltage of a specified memory cell is identified as being below the read reference voltage that is applied to the specified memory cell, then the data stored at the specified memory cell can be read as a particular value (e.g., a logical '1') or determined to be in a particular state (e.g., a set state). If the threshold voltage of the specified memory cell is identified as being above the read reference voltage, then the data stored at the specified memory cell can be read as another value (e.g., a logical '0') or determined to be in another state (e.g., a reset state). Thus, the read reference voltage can be applied to memory cells to determine values stored at the memory cells. Such threshold voltages can be within a range of threshold voltages or reflect a normal distribution of threshold voltages.

A memory device can exhibit threshold voltage distributions $P(Q, V_t)$ that are narrow compared with the working range of control voltages tolerated by the cells of the device. Accordingly, multiple non-overlapping distributions $P(Q_k, V_t)$ ("valleys") can be fit into the working range allowing for storage and reliable detection of multiple values of the charge $Q_k$, k=1, 2, 3 . . . . The distributions (valleys) are interspersed with voltage intervals ("valley margins") where none (or very few) of the cells of the device have their threshold voltages. Such valley margins can, therefore, be used to separate various charge states $Q_k$—the logical state of the cell can be determined by detecting, during a read operation, between which two valley margins the respective threshold voltage $V_t$ of the cell resides. This effectively allows a single memory cell to store multiple bits of information: a memory cell operated with 2N−1 well-defined valley margins and 2N valleys is capable of reliably storing N bits of information. Specifically, the read operation can be performed by comparing the measured threshold voltage $V_t$ exhibited by the memory cell to one or more reference voltage levels corresponding to known valley margins (e.g., centers of the margins) of the memory device in order to distinguish between the multiple logical programming levels and determine the programming state of the cell.

Precisely controlling the amount of the electric charge stored by the cell allows multiple logical levels to be distinguished, thus effectively allowing a single memory cell to store multiple bits of information. One type of cell is a single level cell (SLC), which stores 1 bit per cell and defines 2 logical states ("states") ("1" or "L0" and "0" or "L1") each corresponding to a respective $V_t$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_t$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_t$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use $2^n$ levels of charge to store n bits. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of cells.

A read operation can be performed by comparing the measured threshold voltages ($V_t$) exhibited by the memory cell to one or more reference voltage levels in order to distinguish between two logical levels for single-level cell (SLCs) and between multiple logical levels for multi-level cells. In various embodiments, a memory device can include multiple portions, including, e.g., one or more portions where the sub-blocks are configured as SLC memory, one or more portions where the sub-blocks are configured as multi-level cell (MLC) memory that can store two bits of information per cell, (triple-level cell) TLC memory that can store three bits of information per cell, and/or one or more portions where the sub-blocks are configured as quad-level cell (QLC) memory that can store four bits per cell. The voltage levels of the memory cells in TLC memory form a set of 8 programming distributions representing the 8 different combinations of the three bits stored in each memory cell. Depending on how the memory cells are configured, each physical memory page in one of the sub-blocks can include multiple page types. For example, a physical memory page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical memory page formed from memory cells of the QLC memory type can have a total of four logical pages, where each logical page can store data distinct from the data stored in the other logical pages associated with that physical memory page, which is herein referred to as a "page."

Memory devices can experience random workloads over the course of their operation and lifetime that impact the $V_t$ distributions of their memory cells. For example, the $V_t$ distributions can be shifted to higher or lower values. A temporal shift of $V_t$ (i.e., a shift of the $V_t$ distributions over a period of time), for example, can be caused by a quick charge loss (QCL) that occurs soon after programming and by a slow charge loss (SCL) that occurs as time passes during data retention and can occur due to phenomena referred to as cell-to-cell coupling (C2C) (i.e., capacitive coupling between cells that causes interference) and lateral migration (i.e., charge migration between adjacent cells). Cell-to-cell coupling between cells occurs due to capacitive coupling between charge storage structures (e.g., transistors) of adjacent memory cells. For example, the $V_t$ of a specified cell programmed to a target state (e.g., a particular programming level) can change due to capacitive coupling associated with transistors of adjacent cells. The amount of $V_t$ change (i.e., $V_t$ shift), of the specified cell due to cell-to-cell coupling can depend on the $V_t$ of one or more adjacent cells. Lateral migration can have analogous effects. For example, after a cell adjacent to a specified cell is programmed, the electrons can diffuse laterally (i.e., along the wordline) from the charge storage structure of the adjacent cell toward the charge storage structures of the specified cell by tunneling through intervening layers between them. Moreover, this diffusion can depend on (i.e., may be a function of) the respective programming level of neighboring cells connected to the same bitline as the specified cell. Consequently, lateral migration of charge (i.e., as a function of time and of the programming levels of the adjacent cells on the bitline)

from an adjacent cell on the wordline can also shift the $V_t$ of the specified cell due to the loss of charge (i.e., electrons) that was previously present.

When these effects are considered for memory cells in one or more memory arrays on a memory device, these phenomena can result in a lowering and widening of the $V_t$ distribution for various programmed states of the memory cell and therefore impair the ability of the memory device to accurately read the memory cells. For example, the $V_t$ distribution widening can, in turn, cause a reduction in RWB and thereby negatively affect memory device reliability. In some cases, the RWB degradation can lead to an increase in the number of errors (e.g., bit errors) and/or error rate (e.g., bit error rate (BER), raw bit error rate (RBER)) occurring during access operations performed on the memory device.

To compensate for various $V_t$ distribution shifts, calibration operations can be performed in order to adjust the read level voltages. Such adjustments can be done on a distribution-by-distribution basis, as higher $V_t$ levels tend to incur more temporal shifting than do lower $V_t$ levels. In certain memory devices, read voltage level adjustments can be performed based on values of one or more data state metrics obtained from a sequence of read and/or write operations. In an illustrative example, the data state metric can be represented by the RBER, which refers to the error rate in terms of a measure of bits that contain incorrect data (i.e., bits that were sensed erroneously) when a data access operation is performed on a memory device (e.g., a ratio of the number of erroneous bits to the number of all data bits stored in a certain portion, such as a specified block, of the memory device). In these memory devices, sweep reads can be performed to create RBER/log likelihood ratio (LLR) profiles for error correction code (ECC) and select the most efficient profile. Such calibrations can be performed to accurately predict where valleys are located between $V_t$ distributions for purposes of accurately reading data from the memory cells.

Various workloads experienced by the memory devices can cause data to be written to nonconsecutive wordlines and nonconsecutive blocks. This could result in some portion of the wordlines in a block being coupled to cells that are programmed (such wordlines referred to herein as "programmed") and another portion of the wordlines in a block being coupled to cells that are coupled to cells that are not programmed (i.e., in an erased state) (such wordlines referred to herein as "unprogrammed" or "not programmed"). A block the wordlines of which are all programmed wordlines, is a block that is considered to be in a fully programmed state and can be referred to as a completely programmed block or a complete block. Analogously, a block containing some programmed wordlines and some unprogrammed wordlines is considered to be a block that is in a partially programmed state and can be referred to as a partially programmed block or a partial block.

In many cases, the operation of such memory devices can generate an undesirable effect on a physical block of memory cells called a "back-pattern effect" that causes change in the perceived $V_t$ across the memory cells (e.g., by causing each $V_t$ level to be sensed at lower voltages). The back-pattern effect is primarily exhibited during reads of memory cells in partial blocks and most strongly experienced in scenarios with nearly empty partial blocks (i.e., where the majority of the wordlines are unprogrammed wordlines). The back-pattern effect can be understood, therefore, as an overdrive of current within a bitline of a memory cell array in a block. This overdrive of current is caused by the pass-through voltage ($V_{pass}$) applied to unselected WLs of memory cells of the array that are not programmed. Although initially this $V_{pass}$ is applied to all WLs in a region of a memory device, during a read operation it generally remains applied to unselected WLs to ensure the memory cells coupled to those WLs remain conducting (i.e., turned on) along the BL being used. This back-pattern effect can impact all $V_t$ distributions of the memory array and can, in many cases, not be compensated for via the previously mentioned calibration techniques that aim to compensate for temporal $V_t$ distribution shifts cause by QCL, SCL, C2C, and lateral migration especially if the effects of those phenomena are relatively small.

Because of the lower perceived $V_t$ sensed for some cells when reading partial blocks that experience this back-pattern effect, the raw bit error rate (RBER) experienced during memory access operations increases. Accordingly, the rate at which error handling operations (e.g., remedial ECC operations) are triggered (referred to herein as a "trigger rate") by the memory device during the read operations is likewise increase, even for memory devices in which calibration techniques are employed to address the temporal $V_t$ shifts. This read trigger rate refers to a measure (e.g., a count, or frequency) of read operations that trigger additional read error handling operations (e.g., remedial ECC operations), caused by the high RBER encountered during the read operation. Thus, the read trigger rate can correspond to the probability that an initial attempt to retrieve data fails (e.g., when a code word fails hard decode) and therefore directly correlates with system performance and quality of service (QoS). For example, if a set of data (e.g., codeword) fails a hard bit read operation, an error recovery flow will be triggered and increase the latency of the data being retrieved. This delay negatively impacts QoS and uses additional computing resources. This effect and its negative impacts on memory devices are evident in storage applications for mobile, embedded storage, storage (consumer, client, datacenter devices) or external customers, all of which involve the creation and use of partial block. Furthermore, this back-pattern effect can be expected to worsen as the number of WLs per block and/or per sub-block increases.

Some memory devices compensate for this effect by applying voltage offset during memory access operations the magnitude of which can be determined from data state metric information that indicates whether the cells being read are on a complete or partial block and the portion of the block that is programmed. Accordingly, this compensation can generally depend on determining a value of a chosen metric (e.g., RBER) that reflects the corresponding ratio of programmed to unprogrammed wordlines of the block. The values of metric can be searched in a record (e.g., a look-up-table (LUT) saved in volatile or non-volatile memory on the memory device) to identify corresponding respective voltage offsets that would compensate for the back-pattern effect when applied in read operations performed on the block. However, if a power loss occurs the information matching the values of the metric to corresponding voltage offsets is lost from volatile memory. Therefore, when power is restored, such memory devices resort to having to retrieve this information from storage areas in non-volatile memory. This entails the performance of additional memory access operations simply to retrieve the record (e.g., a LUT) from memory to identify voltage offsets that are to be applied. The operations that are performed to retrieve the record from non-volatile memory further delay the execution of other commands and the performance of other memory access operations, thereby increasing the latency and decreasing the system performance of the memory device.

Aspects of the present disclosure address the above and other deficiencies by compensating for the back-pattern effect caused by partial block programming by offsetting the voltage used during read operations based on a comparison of currents. The various embodiments described herein, can account for the perceived $V_t$ being sensed at an erroneous value when cells on a partially programmed block are read. The difference between the perceived $V_t$ and the actual $V_t$ can be compensated for by offsetting a voltage. In some embodiments, a particular voltage offset can be applied based a signal resulting from the comparison of a current passing through a string (i.e., BL) with a reference current. A property (e.g., magnitude, amplitude, frequency, etc.) of the signal resulting from the comparison can be correlated with an amount of the capacity of the block being programmed (i.e., how full the partially programmed block is). Accordingly, the property of the signal can be correlated with a corresponding voltage offset that can be triggered by the signal to be applied during a memory access operation to compensate for unaccounted $V_t$ shifts caused by the block on which the cells that are being read resides. In this manner a corresponding voltage offset can be applied for a read operation on a memory cell of a partial block even after a loss of power without incurring the delay that retrieving a record indicating voltage offset values corresponding to particular data state metric values would entail.

In an illustrative example, a memory device can receive a request for some data to be retrieved (i.e., a read request). The read request can specify a memory cell on the memory device. In response, the memory device can ramp the voltage applied to the wordline on which the memory cell resides until it reaches a predetermined level and ramp the voltage applied to the bitline on which the memory cell resides until it reaches another predetermined level. Then, by comparing the current passing through the bitline with a reference current, the memory device can generate a signal that causes a corresponding voltage offset to be applied during a sensing operation performed on that memory cell. Because the signal can be correlated with a measure of the portion of the block that is programmed, the control logic of the memory device can be configured to apply the read voltage level offset that would compensate for the effects on the $V_t$ of the cell attributable to the block on which it resides not being fully programmed (i.e., being a partial block).

For example, the memory device can use a comparator circuit to compare the current passing through the bitline (on which the memory cell that is to be read resides) with a reference current that is equivalent to a current that would pass through that bitline if that bit line was on a fully programmed block. This comparison can generate an analog signal indicative of how much of the block is programmed, and the control logic of the memory device can cause a corresponding voltage offset to be applied during a sensing operation performed on the memory cell.

Advantages of the present disclosure include reducing the RBER (and the consequent read trigger rates) associated with partial blocks on memory devices, thus reducing the latency of memory access operations performed by the memory device. More specifically, since error handling flows, such as ECC operations, increase the time elapsed for data to be retrieved and provided to the requesting host system and consume computing resources, then reducing the read trigger rate can decrease the latency, increases the availability of resources for performing other operations.

This reduction in read trigger rates improves the quality of service (QoS) that users will experience in accessing data during read operations. Furthermore, removing the need to access a file system or a storage location in non-volatile memory on the memory device to retrieve information, identifying the voltage offset that should be applied during a particular read operation occurring on a partially pro-grammed block, further reduces the duration of time required to complete the read operation. Thus, as explained in more detail below, the embodiments described in this disclosure improve the performance of memory devices through partial block read compensation. Other advantages will be apparent based on the additional details provided herein.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. The host system 120 can provide data to be stored at the memory sub-system 110 and can request data to be retrieved from the memory sub-system 110. As used herein, "coupled to" or "coupled with" gener-ally refers to a connection between components, which can be an indirect communicative connection or direct commu-nicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM control-ler), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, uni-versal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combina-tion of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in con-junction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

In some embodiments, the memory sub-system 110 includes a compensation management component 113 that can perform partial block read compensation on memory device 130 to account for the impact of the back-pattern effect. In several embodiments, the compensation management component 113 can receive and respond to data access requests from host system 120 and manage compensation by controlling the voltages that are applied during memory access operations on memory device 130. In some embodiments, local media controller 135 can include at least a portion of the compensation management component 113. In other embodiments, the memory sub-system controller 115 can include at least a portion of the compensation management component 113. In some embodiments, the compensation management component 113 is part of the host system 110, an application, or an operating system. In the various embodiments, the compensation management component 113 can comprise control logic and circuitry that is communicatively connected to a controller of the memory sub-system 110 and the memory device 130 and is configured to perform the functionality described herein.

Compensation management component 113 can perform various actions such as handling the interactions of memory sub-system controller 115 with the memory device 130 of memory sub-system 110. For example, in some embodiments, the compensation management component 113 can transmit, to memory device 130 memory access commands that correspond to requests received by memory sub-system 110 from host system 120, such as program commands, read commands, and/or other commands. Furthermore, the compensation management component 113 can compare one or more currents, generate analog signals, and cause voltage offsets to be applied during memory access operations performed on memory device 130.

In some embodiments, the memory sub-system controller 115 can include a processor 117 (processing device) configured to execute instructions stored in local memory 119 for performing the operations described herein. In other embodiments, the operations described herein are performed by the compensation management component 113. In yet other embodiments, local media controller 135 can perform the operations described herein. In at least one embodiment, memory device 130 can include a compensation management component 113 configured to carry out memory access operations (e.g., operations performed in response to memory access commands received from processor 117). In some of these embodiments, the compensation management component 113 can be implemented on memory device 130 using firmware, hardware components (e.g., control circuit logic), or a combination of firmware and hardware components. In an illustrative example, the compensation management component 113 can receive, from a requesting component, such as processor 117, a request to read a data page of the memory device 130 and can respond to it by performing the requested read operation. For the purposes of this disclosure, a read operation can include ramping a voltage applied to a particular wordline of a memory device 130 until it reaches a corresponding predetermined voltage level ramping a voltage applied to a particular bitline of a memory device 130 until it reaches another corresponding predetermined voltage level. The read operation can also include a sensing operation performed on a memory cell located at the intersection of that wordline and bitline.

Accordingly, in some embodiments, a memory device can include an array of memory cells, where each memory cell located at an intersection of a wordline and a bitline, and a compensation management component 113 with control logic that is operatively coupled with the memory array to perform the following operations. The compensation management component 113 can receive a read request that specifies a memory cell connected to a string of series-connected memory cells in an array of memory cells (i.e., a memory cell on a particular block) on the memory device where the string located at an electrical intersection of a wordline and a bitline.

Having received the read request, the compensation management component 113 can, in response, cause the voltage that is applied to the wordline to which the specified memory cell is connected to ramp to a certain predetermined value. In some embodiments, the predetermined value can be a theoretically known voltage level at which current will pass through cells along that wordline (e.g., a pass-through voltage ($V_{pass}$)). In response to receiving the read request, the compensation management component 113 can cause the voltage that is applied to the bitline to which the specified memory cell is connected to ramp to another predetermined value (i.e., can be different value than that of the voltage on the wordline). In some embodiments, the ramping of the voltage on the wordline can begin concurrently (and occur simultaneously) with the ramping of the voltage on the bitline, while in other embodiments, the ramping of the voltage on the wordline can begin asynchronously with the ramping of the voltage on the bitline. For example, the ramping of the voltage on the bitline can begin after the ramping of the voltage on the wordline begins and vice versa.

In some embodiments, the compensation management component 113 can compare (e.g., by using a string sensing circuit with a current comparator), a current along the string (i.e, the string to which the specified memory cell is connected) with a reference current to generate an analog output signal. For example, compensation management component 113 can determine (i.e., sense), by a string current sensing circuit that includes the current comparator, the current along the string to compare it with the reference current. In some embodiments, the reference current can be a current that is theoretically known to be reflective of (i.e., correspond to) a corresponding absolute or corresponding relative number of programmed wordlines or of unprogrammed wordlines on a block of the memory device 130. In other embodiments, the reference current can be a current that is theoretically known to be reflective of (i.e., correspond to) a corresponding percentage or corresponding ratio of programmed wordlines to total wordlines, programmed wordlines to unprogrammed wordlines, or unprogrammed wordlines to total wordlines on the block. In some examples, the reference current can have a magnitude equivalent to the magnitude of the current that would pass through a reference memory cell located in a fully programmed block in the array of memory cells, where the reference memory cell storing an equivalent amount of charge (i.e., is in the same logical state) as the specified memory cell. Based on that comparison, the compensation management component 113 can generate an analog output signal such that it varies with respect to the current along the string. In some embodiments, the analog output signal can be indicative of whether the block (on which the memory cell that was specified in the read request resides) is in a partially programmed state (i.e., whether the block is a partial block). For example, the analog output signal can have a property (e.g. a magnitude, frequency, etc.) that is indicative of the number/portion (e.g., all, half, 12, etc.) of the wordlines on the block that are unprogrammed or that is reflective of the number of wordlines of the block that are connected to programmed memory cells (i.e., programmed wordlines).

Thus, in some embodiments, based on the magnitude of the analog output signal, the compensation management component 113 can cause a voltage offset to be applied to a read voltage level during a sensing operation performed on the specified memory cell. To do so, the compensation management component 113 can adjust the read voltage level that is applied during the sensing operation performed on the specified memory cell to be offset by an amount corresponding to the analog output signal. For example, in some embodiments, the transmission/receipt of the analog output signal, through the function of the logic of the circuitry the compensation memory component 113, local media controller 135, memory sub-system controller 115, or a combination of these elements, can cause an automatic adjustment and offset of the read voltage level that is applied during the sensing operation performed on the specified memory cell. Thus, the compensation management component 113 can perform, using the read voltage level offset, a read operation responsive to the read request.

In some embodiments, the read request can be received by the compensation management component 113 from host system 120, local media controller 135, memory sub-system controller 115, from another component of memory sub-system 110, or from a combination of these elements. The read request can specify a logical address that can correspond to a physical address on a block of the memory device 130 containing the requested data. Accordingly, the read request can contain an indication specifying the memory cell(s) and the block from which data is requested. When the compensation management component 113 receives the request, in response, the compensation management component 113 can use a reference current to apply a read voltage level offset.

More specifically, the compensation management component 113 can compare the string current with multiple reference currents to generate the analog output signal. In some embodiments each analog output signal (or each value of a property of the analog output signal) can be associated with a corresponding read voltage level offset (i.e., the read voltage level offset that is automatically caused to be applied in response to that analog output signal). In some embodiments, the compensation management component 113 can apply the read voltage level offset in a memory access (e.g., read/write) operation performed on the other memory cells of the block other than the specified memory cell. In some embodiments, the compensation management component 113 can issue (e.g., to the memory device 130) a read command that includes the read voltage level offset. Implementations of the various aspects and principles of the operation of the compensation management component 113 mentioned above are described in more detail below with reference to FIGS. 2A-2C. Further details with regards to these generally described operations of the compensation management component 113 are explained below with reference to FIGS. 4-5.

Figure 2A:
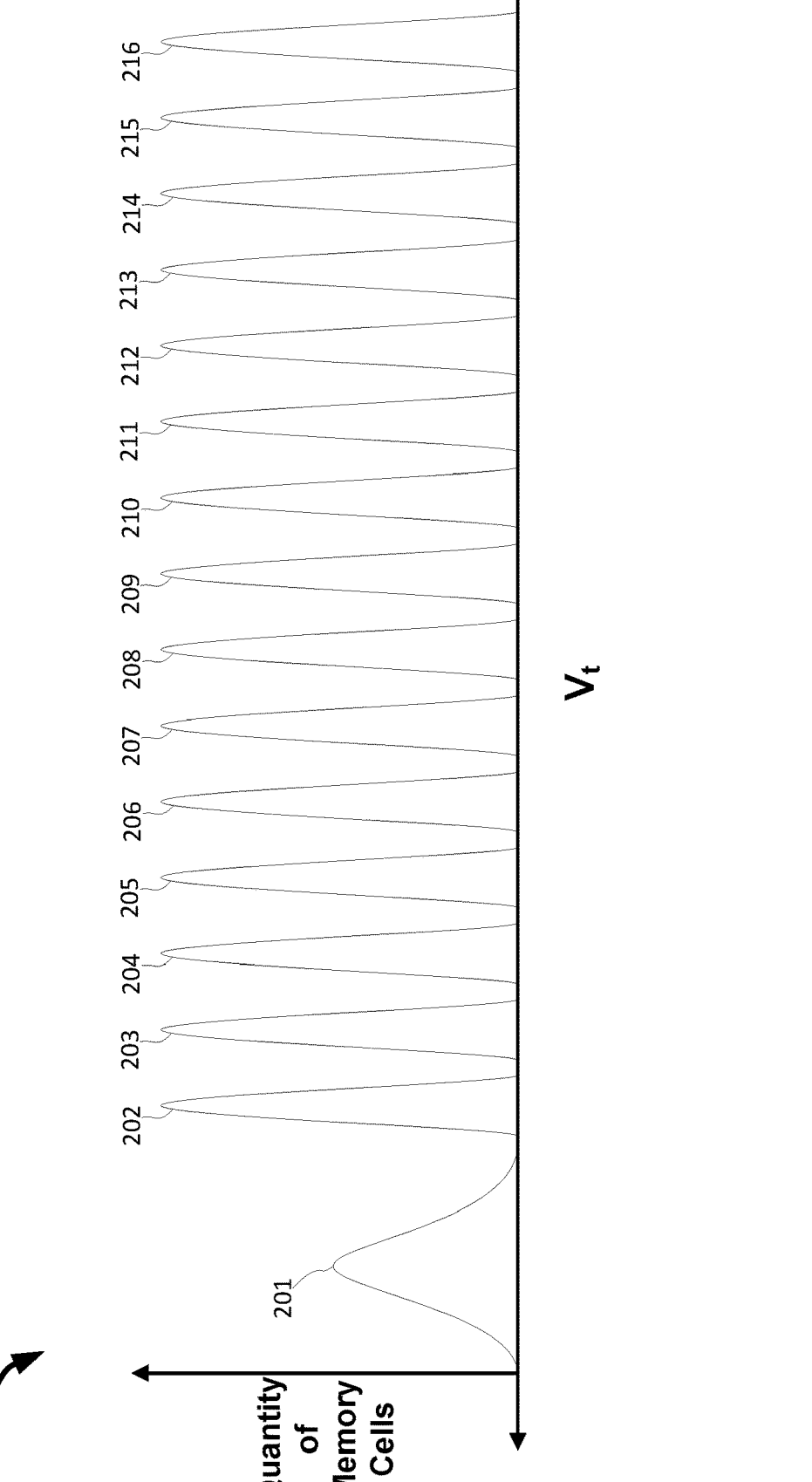
FIG. 2A is a graph of an example set of threshold voltage distributions of multiple memory cells of a memory array in a memory device in accordance with some embodiments of the present disclosure.

FIG. 2A is a graph 200A of an example set of threshold voltage distributions of multiple memory cells of a memory array in a memory device in accordance with some embodiments of the present disclosure. In some embodiments, memory cells on a block of a memory device (e.g., memory device 130 of FIG. 1) can have different $V_t$ values, an aggregate representation of which for a set of these memory cells can be shown with plots on a graph such as graph 200A. For example, a set of $V_t$ ranges and their distributions for a group of sixteen-level memory cells, e.g., QLC memory cells, is depicted in FIG. 2A. In some embodiments, each of these memory cells can be programmed to a $V_t$ that is within one of sixteen different threshold voltage ranges 201-216. Each of the different $V_t$ ranges can be used to represent a distinct programming state that corresponds to a particular pattern of four bits. In some embodiments, the threshold voltage range 201 can have a greater width than the remaining threshold voltage ranges 202-216. This can be caused by the memory cells initially all being placed in the programming state corresponding to the threshold voltage range 201, after which some subsets of those memory cells can be subsequently programmed to have threshold voltages in one of the threshold voltages ranges 202-216. Because write (i.e., programming) operations can be more precisely controlled than erase operations, these threshold voltage ranges 202-216 can have more narrow distributions.

In some embodiments, the threshold voltage ranges 201, 202, 203, 204, 205, 206, 207, 208, 209, 210, 211, 212, 213, 214, 215, and 216 can each represent a respective programming state (e.g., represent L0, L1, L2, L3, L4, L5, L6, L7, L8, L9, L10, L11, L12, L13, L14 and L15 respectively). For example, if the $V_t$ of a memory cell is within the first of the sixteen threshold voltage ranges 201, the memory cell in this case can be said to be in a programming state L0 corresponding to the memory cell storing a 4-bit logical value of '1111' (this can be referred to as the erased state of the memory cell). Thus, if the threshold voltage is within the second of the sixteen threshold voltage ranges 202, the memory cell in this case can be said to be in a programming state L1 corresponding to the memory cell storing a 4-bit logical value '0111'. If the threshold voltage is within the third of the sixteen threshold voltage ranges 203, the memory cell in this case can be storing a programming state L2 having a 4-bit logical value '0011,' and so on. In some embodiments, a correspondence table such as Table 1 can provide a correspondence between the states of the memory cells and their corresponding logical values. Other associations of programming states to corresponding logical data values are envisioned. For the purposes of this disclosure, memory cells that are in the lowest state (e.g., the erased state or L0 data state) can be referred to as unprogrammed, erased, or set to the lowest programming state.

TABLE 1

| Programming State | Logical Programming Value | Programming State | Logical Data Value |
|---|---|---|---|
| L0 | 1111 | L8 | 1100 |
| L1 | 0111 | L9 | 0100 |
| L2 | 0011 | L10 | 0000 |

TABLE 1-continued

| Programming State | Logical Programming Value | Programming State | Logical Data Value |
|---|---|---|---|
| L3 | 1011 | L11 | 1000 |
| L4 | 1001 | L12 | 1010 |
| L5 | 0001 | L13 | 0010 |
| L6 | 0101 | L14 | 0110 |
| L7 | 1101 | L15 | 1110 |

Notably, the operations described herein involve distinguishing one state of a memory cell from another and determining in which of the states a memory cell is in. This determination can be made by focusing the discussion on states represented by two adjacent $V_t$ distributions as explained in more detail with reference to FIG. 2B.

Figure 2B:
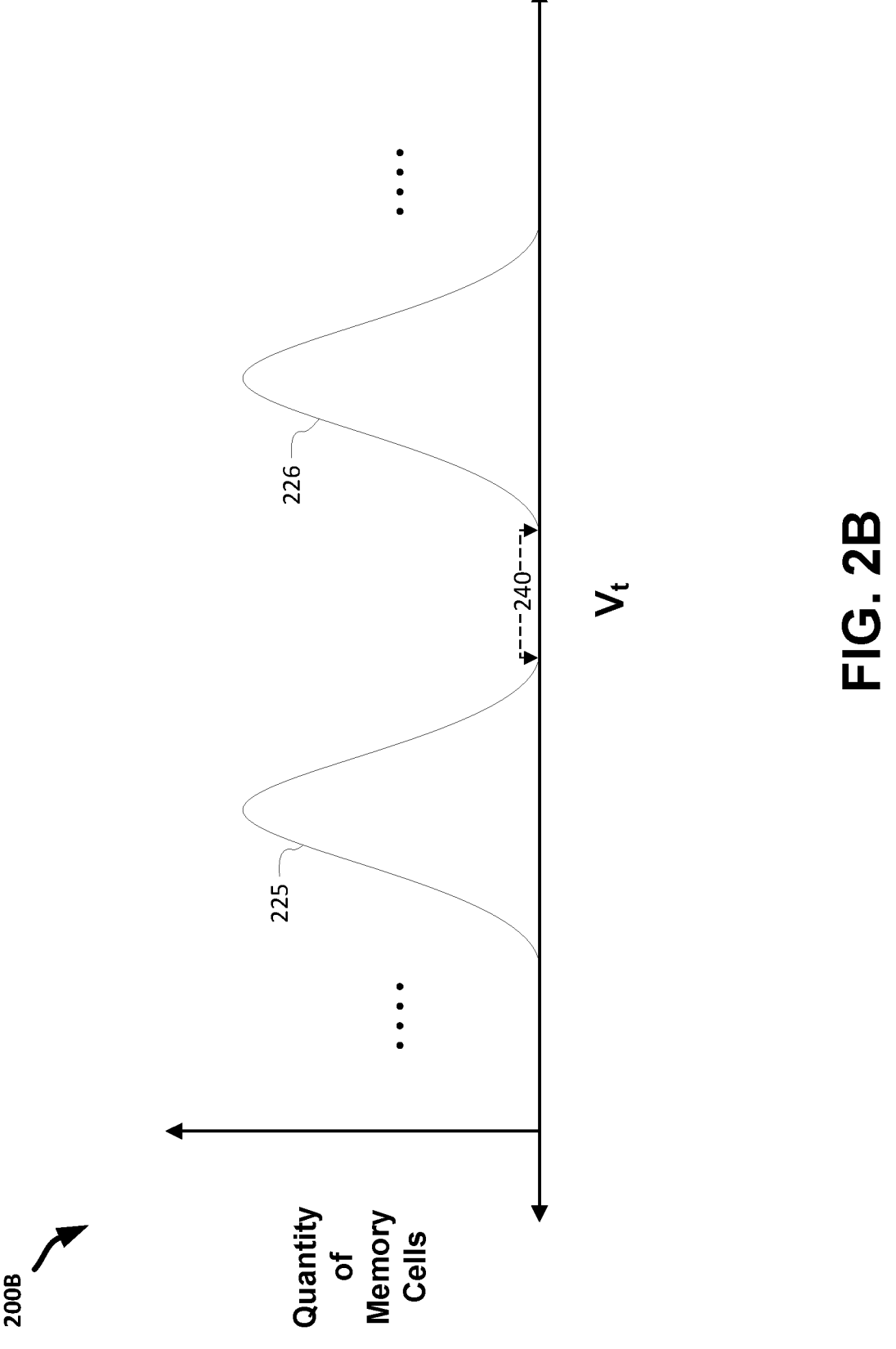
FIG. 2B is a graph of two example threshold voltage distributions of multiple memory cells of a memory array in a memory device in accordance with some embodiments of the present disclosure.

FIG. 2B is a graph 200B of two example threshold voltage distributions of multiple memory cells of a memory array in a memory device in accordance with some embodiments of the present disclosure. Consider the depiction FIG. 2B of an example $V_t$ distribution 225-226 to be analogous to a pair of adjacent $V_t$ distributions from graph 200A of FIG. 2A. For example, the $V_t$ distributions 225-226 of FIG. 2B can represent some portion of the distributions for threshold voltage ranges 201-216 of FIG. 2A after the completion of a write (i.e., programming) operation for a group of memory cells. As seen in FIG. 2B, adjacent threshold voltage distributions 225-226 can be separated by some margin 240 (e.g., empty voltage level space) at the end of a programming operation. Applying a read voltage (i.e., sensing voltage) within the margin 240 to the control gates of the group of memory cells can be used to distinguish between the memory cells of the threshold voltage distribution 225 (and any lower threshold voltage distribution) and the memory cells of the threshold voltage distribution 226 (and any higher threshold voltage distribution).

Due to various phenomena that occur during the lifetime of a memory device including quick charge loss (QCL), slow charge loss (SCL), cell-to-cell coupling (C2C), and lateral migration, the threshold voltage of a memory cell can change over time as the electric charge contained in the cell degrades. As previously discussed, this change results in a shift of the $V_t$ distributions over time and can be referred to as a temporal $V_t$ shift (since the degrading electric charge can cause the voltage distributions to shift along the voltage axis towards lower voltage levels and cause the margin 240 to narrow over time). In various embodiments, this temporal $V_t$ shift, if left unadjusted, reduces the read window margin 240 between the threshold voltage distributions 225-226 over time, and can cause these threshold voltage distributions to overlap, making it more difficult to distinguish between cells whose actual $V_t$ is within the range of one of the two adjacent $V_t$ distributions 225-226. Accordingly, failure to mitigate the temporal $V_t$ shift caused by these phenomena can result in the increased bit error rate in read operations. Further, failing to address or account for the $V_t$ shift across all $V_t$ distributions caused by the back-pattern effect discussed previously can cause increases in read errors, with a corresponding increase in RBER resulting in a high read trigger rate, which in turn negatively impacts overall latency, throughput, and QoS of a memory device. The numbers of distributions, programming levels, and logical values in the illustrative examples of FIGS. 2A-2B are chosen for illustrative purposes and are not to be interpreted as limiting, other embodiments can use various other numbers of distributions, associated programming levels, and corresponding logical values can be used in the various embodiments disclosed herein.

Figure 2C:
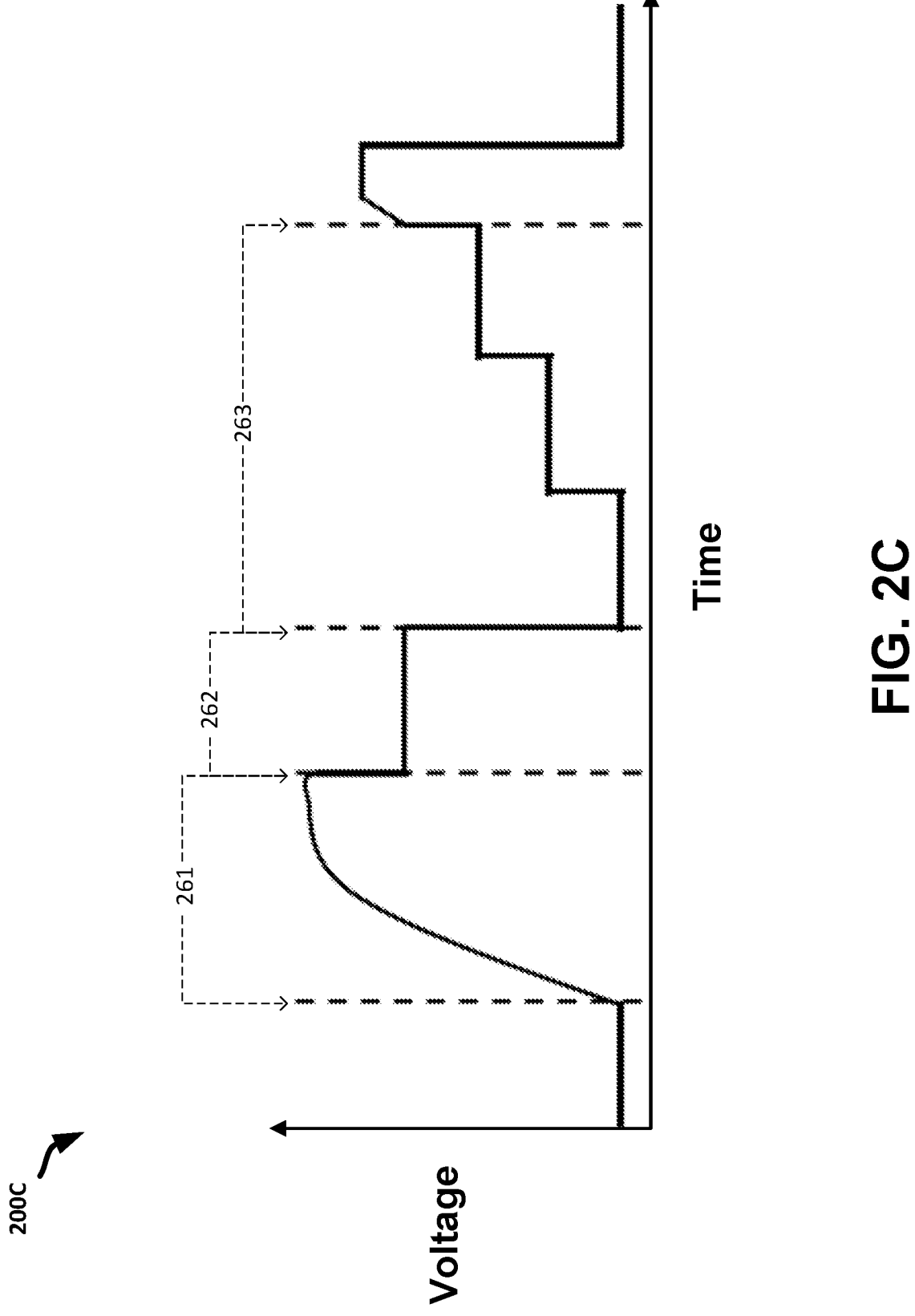
FIG. 2C is a graph of voltage levels applied during consecutive phases of an example read operation in accordance with some embodiments of the present disclosure.

FIG. 2C depicts a graph 200C of voltage levels applied during consecutive phases of an example read operation in accordance with some embodiments of the present disclosure. The graph 200C shows three distinct phases in the example read operation. For example, in some embodiments the read operation can include a first phase 261 that can be referred to as a ramping phase, a second phase 262 that can be referred to as a calibration phase, and a third phase 263 that can be referred to as a read offset phase.

In some embodiments, during a first phase 261, a pass voltage (or "$V_{pass}$") can be applied to particular the wordlines (WLs) of specified bitlines (BLs) of an array of memory cells (e.g., an array of memory cells in memory device 130 of FIG. 1). In various embodiments, for a group of cells programmed to a random logical level (i.e., potentially including all cells being programmed to different levels or to the same logical level), a dynamic (i.e., ramping) $V_{pass}$ applied to the respective WLs of the cells until the $V_{pass}$ rises to a level that causes a current to pass along the string or the BL to which the cells are connected. Reaching a sufficiently high $V_{pass}$ level that causes current to pass along a specified NAND string (or specified BL) can be referred to as tripping the NAND string (or BL) current, or simply tripping. Accordingly, in some embodiments, the dynamic $V_{pass}$ applied to the respective WLs of the cells can trip the string (or BL) current (i.e., dynamic $V_{pass}$ rises to a level sufficiently high to permit a current to pass along a specified string or BL) at different values depending on the number of programmed WLs of the block where the cells are located (i.e., the number of WLs on the block that are coupled with memory cells that have been programmed).

More specifically, as the $V_{pass}$ increases on unselected WLs in the first phase 261 of the operation depicted in FIG. 2C, due to excess (i.e., overdrive of current) passing into the string (or BL), the potential difference experienced along the string (or BL) increases. In a fully programmed block, due to higher programmed threshold voltages ($V_t$) across programmed memory cells, the string current ($I_{string}$) as well as the BL current (IBL) for a given $V_{pass}$ can be several times lower than the current on a WL. In a partially programmed block, since some of the memory cells are in an erased state (for which the $V_t$ of these memory cells is lower), the string current as well as BL current for a particular $V_{pass}$ can be higher due to some portion of the current passing from the WL into the string and into the BL. Accordingly, in a partial block that is just starting to be programmed (i.e., containing at most a threshold number of programmed WLs), the string current and the BL current for a particular $V_{pass}$ can be significantly higher than the string current and the BL current for the same $V_{pass}$ in a fully programmed block. In a fully programmed block, the $V_{pass}$ may need to get to a higher level to trip the string current or the BL current. Conversely, in a partial block, the $V_{pass}$ may not need to get very high to achieve the tripping of the string current or the BL current. Therefore, $V_{pass}$ can be said to trip at a higher level for cells programmed to the same level on fully programmed blocks than for those on partially programmed blocks.

In some embodiments, the compensation management component 113 can ramp the voltage the wordline to which the specified memory cell (and its NAND string) is connected until the voltage reaches a predetermined $V_{pass}$ level (i.e., the $V_{pass}$ level that causes a current to pass along the string). The compensation management component 113 can then sense the current passing through the string ($I_{string}$) to which the specified memory cell is connected and compare it with one or more reference currents (which can be representative of a raw number value or a ratio of the number of programmed WLs of the block on which the specified memory cell resides). In some embodiment, the compensation management component 113 can generate an analog output signal based on the comparison to automatically apply a read voltage level offset. The, analog output signal can cause the compensation management component 113 to generate a read command indicating the specified memory cell that is to be read along with the read voltage level offset signal corresponding to the analog output signal obtained from the comparison. In various embodiments, the compensation management component 113 can adjust the read voltage to be applied to the memory cells during the third phase 263 of the read operation by applying the corresponding read voltage level offset to the read voltage.

In some embodiments, the second phase 262 of the read operation can also optionally include additional calibration of the read voltage (i.e., "read calibration") for cells having particular $V_t$ distributions. The term read calibration can refer to the application of a series of read voltages to determine the voltage that minimizes the number of incorrectly sensed memory cell states (i.e., minimizes the number of bit errors). For example, to adjust the read voltage, the compensation management component 113 can perform a first read calibration that causes the application a first voltage offset corresponding to the number of programmed wordlines in a partial block. The compensation management component 113 can further perform a second read calibration to determine a second voltage offset that compensates for a temporal $V_t$ shift associated with a selected WL. The compensation management component 113 can further combine the second voltage offset (that compensates for temporal $V_t$ distribution shift) and the first voltage offset (that compensates for the back-pattern effect based on the number of programmed WLs) to cause an application of a combined voltage offset during a read operation or sensing operation.

As noted, in some embodiments, the compensation management component 113 can compare the $I_{string}$ with a reference current ($I_{ref}$) that reflects a particular number of wordlines in a block that are connected to memory cells that have been programmed. Upon the generation of the analog output signal based on the comparison, the compensation management component 113 can automatically, through control, cause a voltage offset corresponding to the number of programmed wordlines on the block to be applied to the specified memory cell. In some embodiments, the voltage offset is an optimal read voltage level offset intended to compensate for the partial block condition of the memory array (i.e., compensate for the back-pattern effect or other effect caused by the specific number of unprogrammed WLs in the block). To apply the correct read voltage level offset upon receiving the and the analog output signal, in some embodiments, the compensation management component 113, local media controller 135, or memory sub-system controller 115 can be configured with control logic circuitry, such that each received analog output signal generates the corresponding read voltage level offset or causes the corresponding read voltage level offset to be applied. The above mentioned control logic or circuitry can be structured such each analog output signal (reflecting a particular range of an amount of programed WLs) causes a corresponding read voltage level offset to be applied as seen in the example Table 2 shown below.

TABLE 2

| Output Signal Value | WL# | Read voltage level offset |
| --- | --- | --- |
| $N_1$ | WL2-14 | $V_1$ mV |
| $N_2$ | WL15-31 | $V_2$ mV |
| $N_3$ | WL32-61 | $V_3$ mV |
| $N_4$ | WL62-90 | $V_4$ mV |
| $N_5$ | WL91-140 | $V_5$ mV |
| $N_6$ | WL141-180 | $V_6$ mV |

Accordingly, in some embodiments, each of the analog output signals (with their respective corresponding ranges of amounts of programmed WLs in the block where the specified memory cell resides) can have different corresponding voltage offsets. Thus, for example, if the specified memory cell is located within a block that contains 40 programmed wordlines, the analog output signal value generated by the comparison of the parents would be $N_3$, because this would mean that the block contains an amount of programmed WLs that is in the range of 32-61 WLs. Accordingly, a corresponding offset of $V_3$ mV could be applied or caused to be applied by compensation management component 113. These as well as the other operations mentioned above are explained in additional detail with reference to FIG. 3.

Figure 3:
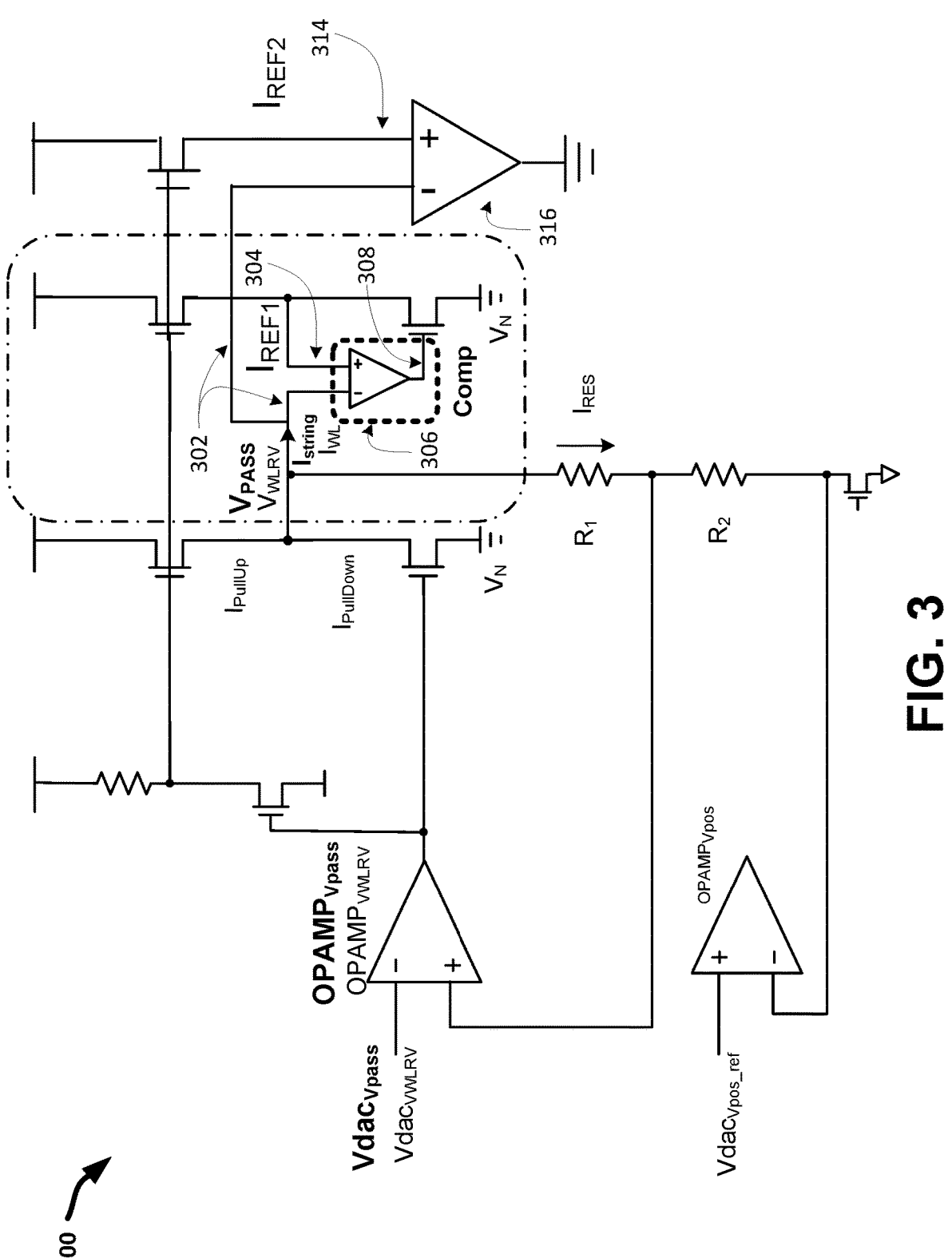
FIG. 3 depicts a schematic diagram, illustrating an example circuit that includes a comparator in accordance with some embodiments of the present disclosure.

FIG. 3 diagram, illustrating an example circuit 300 that includes a comparator 306 in accordance with some embodiments of the present disclosure. In some embodiments, the memory subsystem 110 whether as a separate element, or an element integrated into the circuitry and the control logic of memory sub-system controller 115, the local media controller 135, or the compensation management component 113, can include the example circuit 300, which can be used to compare currents.

As depicted, the current through the string ($I_{string}$) 302 can be transmitted to and received by the comparator through the use of current mirrors. Furthermore, a reference current ($I_{REF1}$) 304 can be transmitted to and received by the comparator as well. In the various embodiments, the comparator 306 can compare the string current 302 with the reference current 304 to generate an analog output signal 308 that can be reflective of an amount of programmed word lines in the block that contains the memory cell specified in a read request.

As noted above the string current 302, can be compared with more than one reference current. For example, the string current 302 can also be compared with reference current 314 through the use of another comparator 316. Although the depicted embodiment shows the use of two comparators, are there embodiments can include additional comparators to compare the string current with as many reference voltages as necessary to cause a proper corresponding read voltage level offset to be applied.

FIG. 4 is flow diagram of an example method 400 for performing partial block read compensation on memory devices in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the compensation management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In some embodiments of the present disclosure, at operation 420, the processing logic can receive a read request that specifies a memory cell a memory cell on a block of a memory device. The specified cell can be in an array of memory cells that includes multiple strings of series-connected memory cells, where each string located at an intersection of a wordline and a bitline (e.g., memory device 130 of FIG. 1). Accordingly, at operation 420, the processing logic can receive a read request that specifies a memory cell connected to a string of the plurality of strings of the array.

Having received the read request at operation 420, the processing logic can, at operation 422, cause the voltage applied to the wordline to which the specified memory cell is connected to ramp to a predetermined value. For example, the processing logic can, at operation 422, cause the voltage applied to that wordline to ramp up to a $V_{pass}$ level or, in some embodiments, to a higher level at which all the cells along that wordline will be activated (i.e., turn on, permit current to pass through them). In response to the read request, the processing logic can also, at operation 424, cause the voltage applied to the bitline to which the specified memory cell is connected to ramp to another predetermined value. For example, the processing logic can, at operation 424, cause the voltage applied to that bitline to ramp up to the voltage level value at which a sensing operation will be performed on the specified cell. In some cases this predetermined value can depend on a property of the cell (e.g., a measure of reliability of the memory cell), In some embodiments, at block 426 the processing logic can compare, by using dedicated circuitry that includes a current comparator, the current along the string (to which the specified cell is connected) with a reference current to generate an analog output signal. In one example, if the current along the string is greater than the reference current, the analog output signal can be negative. In another example, if the current along the string is less than the reference current, the analog output signal can be positive.

Thus, the processing logic can, at operation 428, cause a voltage offset, based on a magnitude of the analog output signal, to be applied to a read voltage level during a sensing operation performed on the specified memory cell. Additional details of partial block read compensation on memory devices are provided below with reference to FIG. 5.

FIG. 5 is a flow diagram of another example method 500 for performing partial block read compensation in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the compensation management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In several embodiments described herein, operations of example method 500 can be performed together with or instead of operations of example method 400. In some embodiments, that operation 520, the processing logic can receive a read request that specifies a memory cell connected to a string of series-connected memory cells in an array of memory cells (i.e., a memory cell on a particular block) on a memory device where the string located at an electrical intersection of a wordline and a bitline. In response to receiving the read request, the processing logic can, at operation 522, cause the voltage that is applied to the wordline to which the specified memory cell is connected to ramp to a certain predetermined value. In some embodiments, the predetermined value can be a theoretically known voltage level at which current will pass through cells along that wordline (e.g., a pass-through voltage ($V_{pass}$)). In response to receiving the read request, can also, at operation 524, cause the voltage that is applied to the bitline to which the specified memory cell is connected to ramp to another predetermined value (i.e., the predetermined value can be a different value than that of the voltage on the wordline). In some embodiments, the ramping of the voltage on the wordline can begin concurrently (and occur simultaneously) with the ramping of the voltage on the bitline, while in other embodiments, the ramping of the voltage on the wordline can begin asynchronously with the ramping of the voltage on the bitline. For example, the ramping of the voltage on the bitline can begin after the ramping of the voltage on the wordline begins and vice versa.

In some embodiments, the processing logic can, at operation 523, determine whether the voltage applied to the word line as well as whether the voltage applied to the bit line have reached their respective predetermined values. In Response to determining, at operation 523, that both the voltage applied to the word line and the voltage applied to the bit line have reached their respective predetermined values the processing logic can, at operation 526, compare (e.g., through a current comparator), a current along the string (i.e, the string to which the specified memory cell is connected) with a reference current to generate an analog output signal. For example, an operation 525, the processing logic can determine (i.e., sense), by a string current sensing circuit that includes the current comparator, the current along the string to compare it with the reference current. In some embodiments, the reference current can be a current that is theoretically known to be reflective of (i.e., correspond to) a corresponding absolute or corresponding relative number of programmed wordlines or of unprogrammed wordlines on a block of the memory device 130. In other embodiments, the reference current can be a current that is theoretically known to be reflective of (i.e., correspond to) a corresponding percentage or corresponding ratio of programmed wordlines to total wordlines, programmed wordlines to unprogrammed wordlines, or unprogrammed wordlines to total wordlines on the block. In some examples, the reference current can have a magnitude equivalent to the magnitude of the current that would pass through a reference memory cell located in a fully programmed block in the array of memory cells, where the reference memory cell storing an equivalent amount of charge (i.e., is in the same logical state) as the specified memory cell.

Based on that comparison, the processing logic can, at operation 527 generate an analog output signal such that it varies with respect to the current along the string. In some embodiments, the analog output signal can be indicative of whether the block (on which the memory cell that was specified in the read request resides) is in a partially programmed state (i.e., whether the block is a partial block). For example, the analog output signal can have a property (e.g. a magnitude, frequency, etc.) that is indicative of the number/portion (e.g., all, ⅓, 25, etc.) of the wordlines on the block that are unprogrammed or that is reflective of the number of wordlines of the block that are connected to programmed memory cells (i.e., programmed wordlines).

Further, in some embodiments, based on the magnitude of the analog output signal, and at operation 528, the processing logic can cause a voltage offset to be applied to a read voltage level during a sensing operation performed on the specified memory cell. In some cases, at operation 529, the processing logic can adjust the read voltage level that is applied during the sensing operation performed on the specified memory cell to be offset by an amount corresponding to the analog output signal. For example, in some embodiments, the transmission/receipt of the analog output signal, the processing logic can, at operation 529, cause an automatic adjustment and offset of the read voltage level that is applied during the sensing operation performed on the specified memory cell. Thus, the compensation management component 113 can perform, using the read voltage level offset, a read operation responsive to the read request.

In some embodiments, the read request can be received by the processing logic from host system 120, local media controller 135, memory sub-system controller 115, from another component of memory sub-system 110 of FIG. 1, or from a combination of these elements. The read request can specify a logical address that can correspond to a physical address on a block of the memory device containing the requested data. Accordingly, the read request can contain an indication specifying the memory cell(s) and the block from which data is requested. When the read request is received, in response, the processing logic can use a reference current to apply an appropriate read voltage level offset.

More specifically, through the comparison of bring current with one or more reference currents and operation 126, the processing logic can generate the analog output signal that corresponds to an amount of WLs that are programmed on the block containing the specified memory cell. In some embodiments each analog output signal (or each value of a property of the analog output signal) can be associated with a corresponding read voltage level offset (i.e., the read voltage level offset that is automatically caused to be applied in response to that analog output signal). Thus, at operation 528, the processing logic can also apply the read voltage level offset in a memory access (e.g., read/write) operation performed on the other memory cells (i.e., other than the specified memory cell) of the block. To accomplish this, in some embodiments, at operation 529 the processing logic can issue a read command that includes the read voltage level offset.

Figure 6:
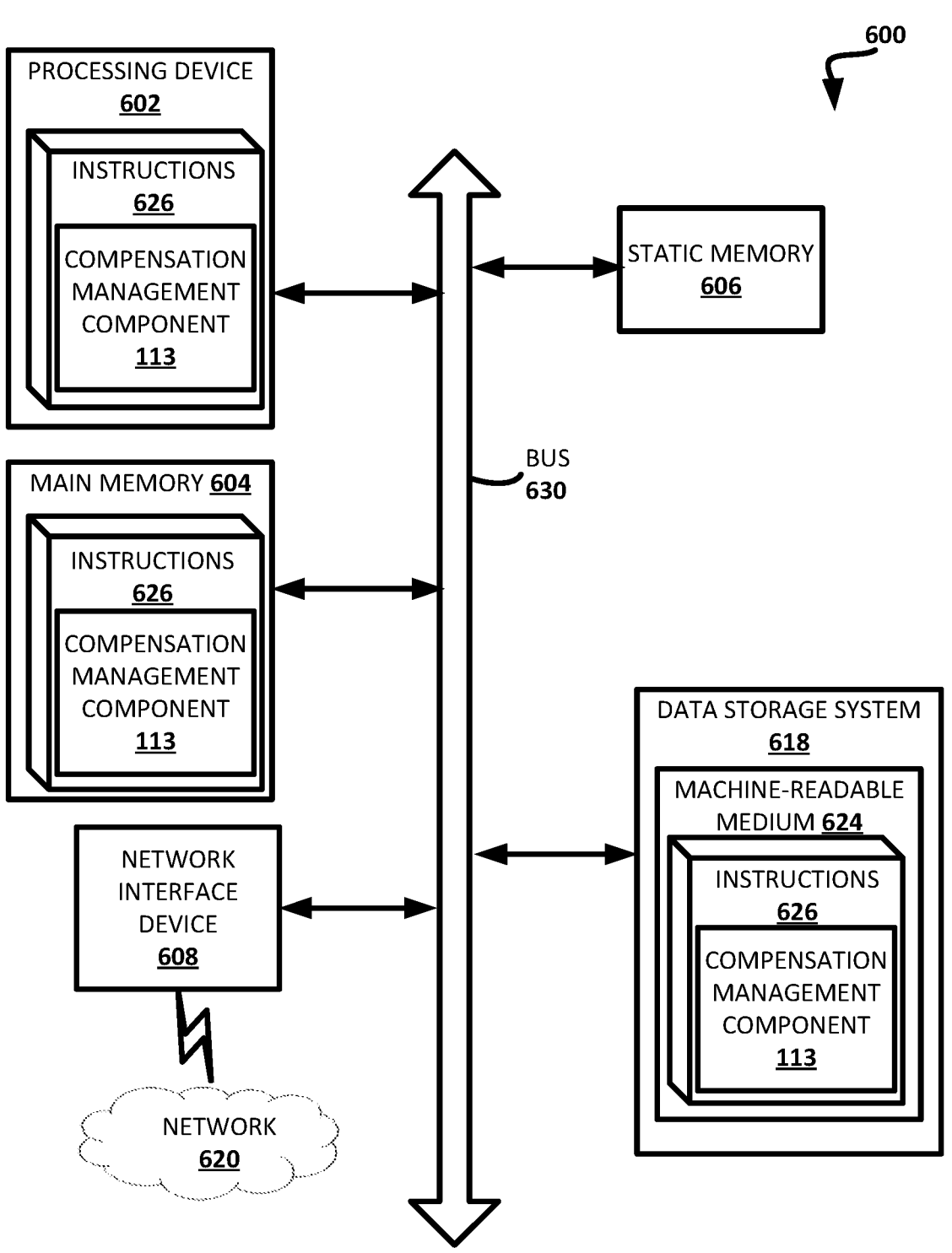
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the compensation management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a compensation management component (e.g., the compensation management component 113 of FIG. 1 and the methods 400, and 500 of FIGS. 4, and 5 respectively). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:

a memory array comprising a plurality of wordlines and a bitline, wherein the memory array comprises a plurality of strings of series-connected memory cells connected to the bitline, and wherein each memory cell is associated with a respective wordline of the plurality of wordlines; and control logic, operatively coupled with the memory array to perform operations comprising:

receiving a read request directed to a specified memory cell in a string of the plurality of strings of the memory array;

causing a first voltage applied to a wordline with which the specified memory cell is associated to ramp to a first predetermined value;

causing a second voltage applied to the bitline to which the string is connected to ramp to a second predetermined value;

comparing, using a current comparator, a current along the string with a reference current to generate an analog output signal; and causing a voltage offset, based on a magnitude of the analog output signal, to be applied to a read voltage level applied to the wordline during a sensing operation performed on the specified memory cell.

2. The memory device of claim 1, wherein the control logic comprises a string current sensing circuit comprising the current comparator, the string current sensing circuit to determine the current along the string, wherein the analog output signal varies with respect to the current along the string, such that the voltage offset varies by a respective corresponding amount.

3. The memory device of claim 1, wherein the reference current has a magnitude equivalent to the magnitude of the current that would pass through a reference memory cell located in a fully programmed block in the array of memory cells, the reference memory cell storing an equivalent amount of charge as the specified memory cell.

4. The memory device of claim 1, wherein the analog output signal reflects a difference between the current along the string and the reference current.

5. The memory device of claim 1, wherein comparing the current is performed responsive to both the first voltage reaching the first predetermined value and the second voltage reaching the second predetermined value.

6. The memory device of claim 1, wherein the ramping of the first voltage begins concurrently with the ramping of the second voltage.

7. The memory device of claim 1, wherein the ramping of the second voltage begins after the ramping of the first voltage begins.

8. A method comprising:

receiving a read request directed to a specified memory cell in a string of series-connected memory cells in a memory array of a memory device, wherein the memory array comprises a plurality of wordlines and a bitline, wherein the memory array comprises a plurality of strings connected to the bitline, and wherein each memory cell is associated with a respective wordline of the plurality of wordlines;

causing a first voltage applied to a wordline with which the specified memory cell is associated to ramp to a first predetermined value;

causing a second voltage applied to the bitline to which the string is connected to ramp to a second predetermined value;

comparing, using a current comparator, a current along the string with a reference current to generate an analog output signal; and causing a voltage offset, based on a magnitude of the analog output signal, to be applied to a read voltage level applied to the wordline during a sensing operation performed on the specified memory cell.

9. The method of claim 8, further comprising:

determining, by a string current sensing circuit comprising the current comparator, the current along the string to compare it with the reference current;

generating the analog output signal such that it varies with respect to the current along the string; and adjusting the read voltage level applied during the sensing operation performed on the specified memory cell to be offset by an amount corresponding to the analog output signal.

10. The method of claim 8, wherein the reference current has a magnitude equivalent to the magnitude of the current that would pass through a reference memory cell located in a fully programmed block in the array of memory cells, the reference memory cell storing an equivalent amount of charge as the specified memory cell.

11. The method of claim 8, wherein the analog output signal reflects a difference between the current along the string and the reference current.

12. The method of claim 11, wherein comparing the current is performed responsive to both the first voltage reaching the first predetermined value and the second voltage reaching the second predetermined value.

13. The method of claim 11, wherein the ramping of the first voltage begins concurrently with the ramping of the second voltage.

14. The method of claim 8, wherein the ramping of the second voltage begins after the ramping of the first voltage begins.

15. A non-transitory computer-readable storage medium comprising instructions that, when executed by a processing device, cause the processing device to perform operations comprising:

receiving a read request directed to a specified memory cell in a string of series-connected memory cells in a memory array of a memory device, wherein the memory array comprises a plurality of wordlines and a bitline, wherein the memory array comprises a plurality of strings connected to the bitline, and wherein each memory cell is associated with a respective wordline of the plurality of wordlines;

causing a first voltage applied to a wordline with which the specified memory cell is associated to ramp to a first predetermined value;

causing a second voltage applied to the bitline to which the string is connected to ramp to a second predetermined value;

comparing, using a current comparator, a current along the string with a reference current to generate an analog output signal; and causing a voltage offset, based on a magnitude of the analog output signal, to be applied to a read voltage level applied to the wordline during a sensing operation performed on the specified memory cell.

16. The non-transitory computer-readable storage medium of claim 15, wherein the reference current has a magnitude equivalent to the magnitude of the current that would pass through a reference memory cell located in a fully programmed block in the array of memory cells, the reference memory cell storing an equivalent amount of charge as the specified memory cell.

17. The non-transitory computer-readable storage medium of claim 15, wherein the analog output signal reflects a difference between the current along the string and the reference current.

18. The non-transitory computer-readable storage medium of claim 15, wherein comparing the current is performed responsive to both the first voltage reaching the first predetermined value and the second voltage reaching the second predetermined value.

19. The non-transitory computer-readable storage medium of claim 18, wherein the ramping of the first voltage begins concurrently with the ramping of the second voltage.

20. The non-transitory computer-readable storage medium of claim 18, wherein the ramping of the second voltage begins after the ramping of the first voltage begins.

* * * * *